United States Patent [19]

Isherwood et al.

[11] Patent Number: 4,943,446
[45] Date of Patent: Jul. 24, 1990

[54] METALLIZATION OF SUBSTRATES

[75] Inventors: Harold Isherwood, Llangattock Powys; Roy A. H. Iles, Crickhowell Powys, both of United Kingdom

[73] Assignee: Dennison Manufacturing Company, Framingham, Mass.

[21] Appl. No.: 649,385

[22] Filed: Sep. 11, 1984

[51] Int. Cl.⁵ .............................................. B05D 3/12
[52] U.S. Cl. ......................................... 427/9; 427/10; 427/250
[58] Field of Search .................. 427/9, 10, 250, 251, 427/252, 253

[56] References Cited

U.S. PATENT DOCUMENTS

| | | | |
|---|---|---|---|
| 3,086,889 | 4/1963 | Strong | 427/10 |
| 3,576,670 | 4/1971 | Hammond | 427/9 |
| 4,051,270 | 9/1977 | Butler | 427/9 |

Primary Examiner—Sadie Childs
Attorney, Agent, or Firm—George E. Kersey; Arthur B. Moore; Barry D. Josephs

[57] ABSTRACT

A method of metallizing a substrate by applying a metallic film to the substrate and measuring the film at a plurality of different lateral positions of the substrate by inducing an eddy current in the film and detecting the magnitude of the film to provide an indication of film thickness.

2 Claims, 12 Drawing Sheets

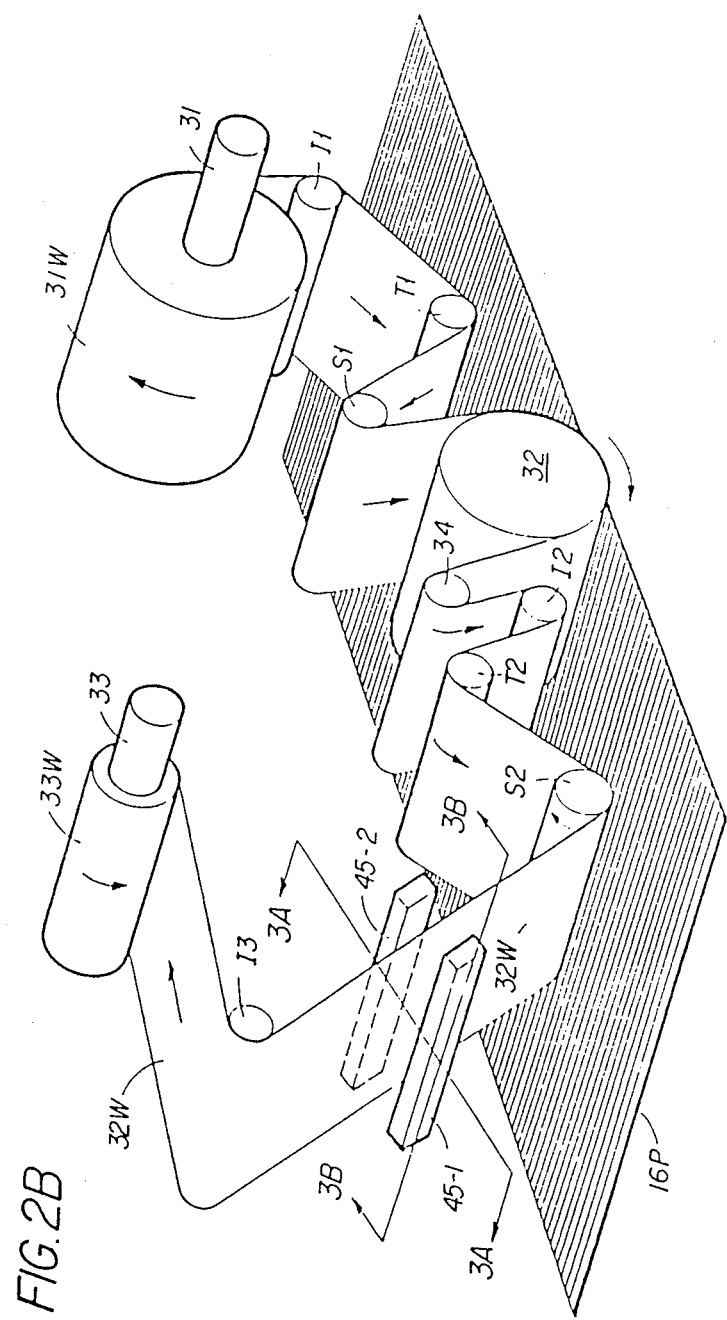

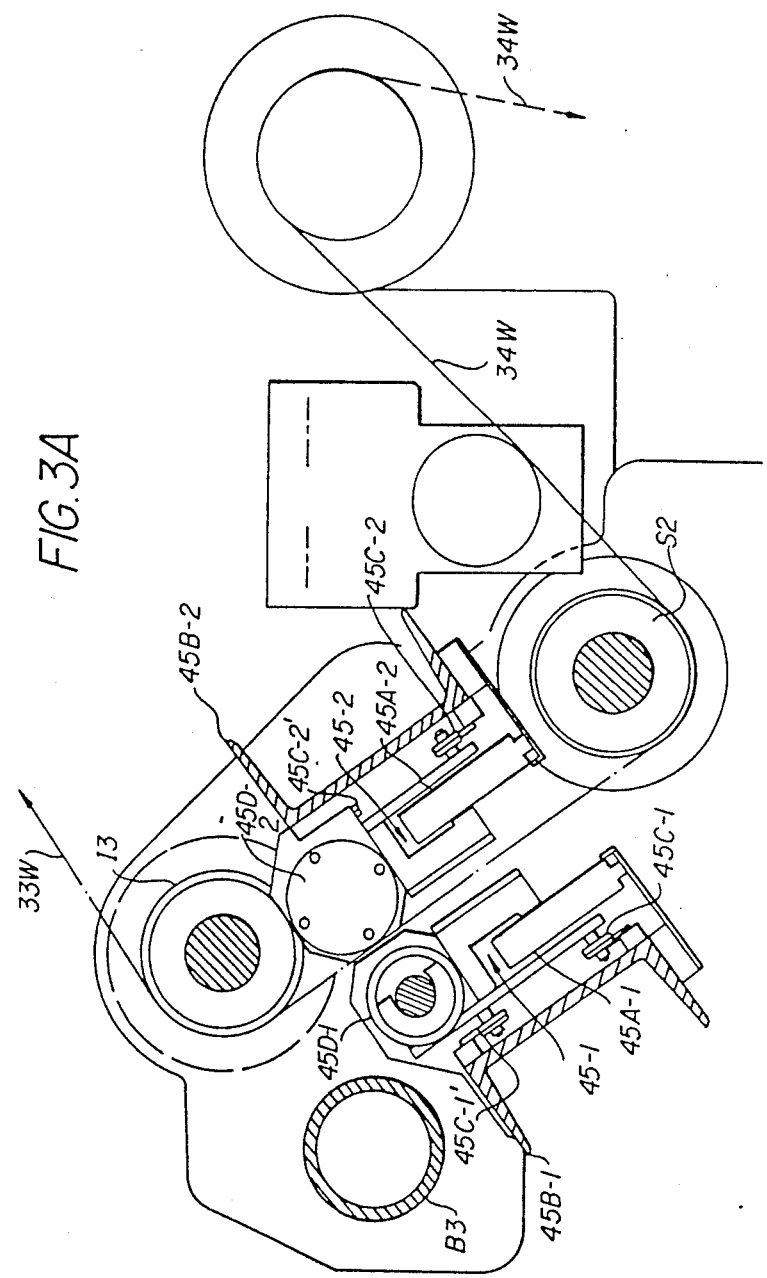

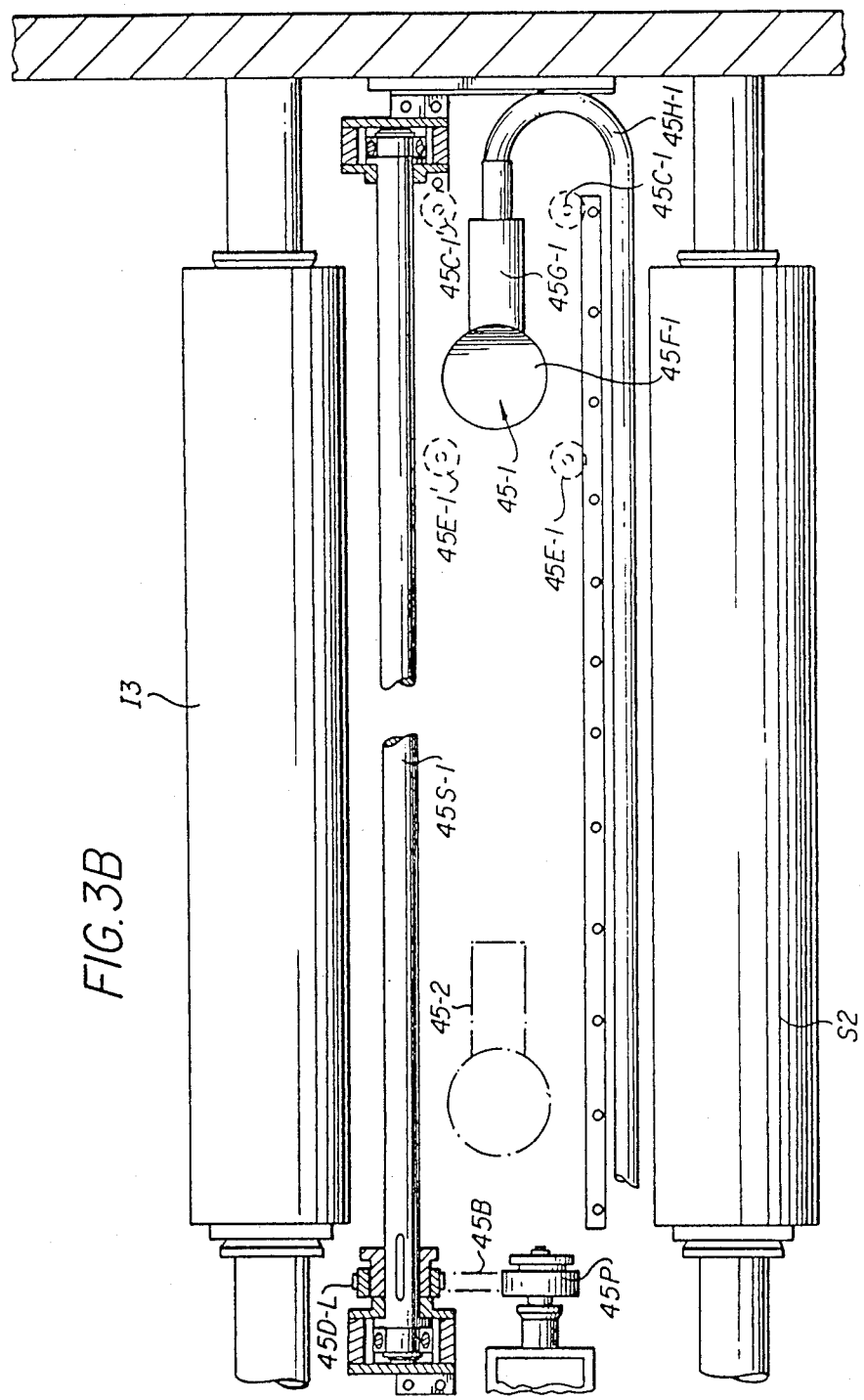

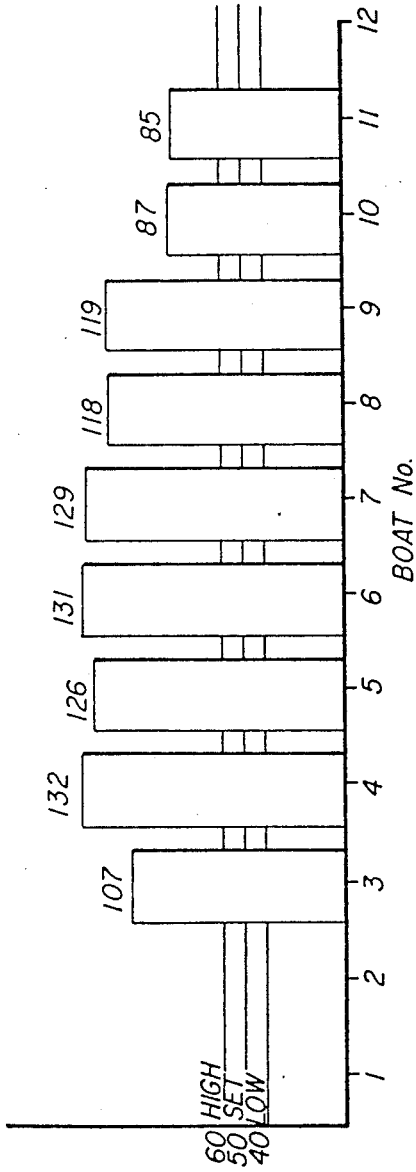
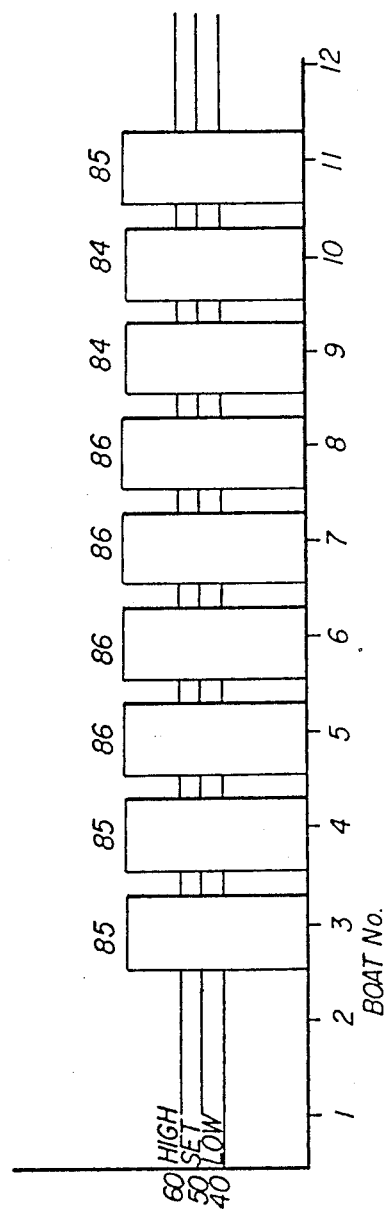

METALLIZATION OF SUBSTRATES

BACKGROUND OF THE INVENTION

This invention relates to the metallization of substrates and more particularly to the measurement and control of metallic films formed on substrates.

In the metallization of substrates, such as foils and the like, a carrier or receptor is placed in a vacuum chamber where metal is evaporated and caused to form a film.

In the general case, the metal being vaporized is located at a specific position within the chamber. As a result, the subsequent vaporization does not produce a uniform film. In partial compensation, the vaporization is made to take place at various positions relative to the substrate. In the case of paper wound on a roll, for example, sources of metal for vaporizationl are distributed at various positions along the axis of the roll, which is unwound and exposed to metallic vapors.

Although the foregoing procedure improves the distribution of metal relative to the carrier, there is a tendency for the deposited film to be nonuniform, particularly in regions between the sources of metal. The latter are commonly known as "boats" because they are shaped like vessels and each contains a pool of vaporizable metal.

Accordingly it is an object of the invention to facilitate the metallization of substrates. A related object is to facilitate the deposit of metallic material on carriers.

A related object is to facilitate the deposit of metallic material, such as aluminum, on paper and plastic sheeting. Another related object is to facilitate the deposit of metallic materials by continuous evaporation in a vacuum.

Still another object of the invention is to control the deposit of metallic material on substrates. A related object is to achieve uniformity in the deposit of metallic films, particularly on substrates such as plastic or paper.

A further object of the invention is to measure the deposit of metallic material. A related object is to measure individual deposits made from different metallization sources. Still another object is to measure metallic deposits with precision, particularly from multiple sources of metallic vapor.

Yet another object of the invention is to control the thickness of a metallic film deposited on a carrier, particularly when produced by multiple vaporization sources.

SUMMARY OF THE INVENTION

In accomplishing the foregoing and related objects the invention provides for the controlled application of a thin film to a carrier, which can be of plastic or paper. The resulting metallic film is measured at a plurality of different lateral positions relative to the direction of longitudinal movement of the carrier. This procedure is to be contrasted with the prior art in which a measuring instrumentality is located at a single lateral position in relation to the carrier.

In accordance with the present invention the measuring instrumentality is movable to a variety of lateral positions relative to the direction of movement of the carrier. In this way a desired parameter, such as the thickness of a deposited metallic film, can be measured at any predetermined position of the carrier. This technique avoids the difficulties of the prior art in which the measuring instrumentality was located at a single position so that the thickness of film deposited away from the measurement position could be determined. The result was that the measurement parameters at conditions away from the measurement position are unknown and undetermined.

In accordance with one aspect of the invention the measurement at a plurality of different lateral positions of the carrier is made by the use of a measuring instrumentality which traverses the carrier. The traverse can be accomplished by mounting the measuring instrumentality for screw feed or cable feed. A particularly suitable cable arrangement employs a closed loop which is rotated, with an attached measurement head, to the desired measurement position while the metallized web is in motion.

In accordance with another aspect of the invention measurements are made along a diagonal of the web which is metallized at a plurality of different positions within a vacuum metallizing chamber.

In accordance with yet another aspect of the invention, the measurements are used to produce control signals which indicate selected parameters at the measurement position, for example relative thickness, and also are able to control the metallizing operation. Accordingly, the thickness of the metallic deposit can be increased when the indication at the measurement position is that the film is too thin, or the thickness can be decreased when the measurement indicates that the film is too thick.

The control signals produced by the measurement head can be used to adjust the vaporization temperatures at the various boat positions of the metal, or increase the rate of feed of wire into the boat and the amount of molten material available for vaporization.

Other techniques for controlling the amount of the metallic deposit in accordance with the control signals produced by the measuring head include the lateral repositioning of the boats and the relative movement of the boats closer to or farther from the web being metallized. Where two lateral measurements indicate a relative decrease in the thickness of the metallized film, compensation can be made by shifting the boats to increase their concentration at the area where the film is substandard. Alternatively in areas where the film is too thick suitable compensation can be made by moving the boats away from the web that is being metallized.

In accordance with yet another aspect of the invention the measurement of the thickness of metallization is accomplished using two movable coils. One of the coils is energized by an oscillator at a prescribed fixed frequency. This produces an eddy current in the metallic film which is detected by a second coil in the vicinity of the first coil.

In accordance with still another aspect of the invention it is desirable for the carrier and its associated metallic film to pass between the two coils which are aligned with one another and positioned on opposite sides of the carrier. The coil that induces the eddy currents in the metallic film is on the metallized side of the carrier and in alignment with the detecting coil on the opposite side. This arrangement of the two coils relative to the metallized film achieves reduced noise and greater accuracy. In addition it is desirable for the circuit of the detecting coil to include a temperature compensating amplifier. The reason is that initial calibration is with reference to a metallized film of prescribed thickness at a prescribed temperature, for example room temperature. During subsequent metallization the metallized film is at an elevated temperature depending upon the deposit conditions in the vacuum chamber. It is therefore desirable for a compensation to be made to take into account the increase in temperature that occurs during the actual metallizing process, as compared with the comparatively lower temperature that applies during calibration.

DESCRIPTION OF THE DRAWINGS

Other aspects of the invention will become apparent after considering several illustrative embodiments taken in conjunction with the drawings in which:

FIG. 2B is an expanded perspective view showing the internal arrangement of the vacuum chamber of FIGS. 1A and 1B with respect to various rolls employed in producing a metallized film on a carrier;

FIG. 3A is a cross sectional view of FIG. 2B showing details for a measurement system in accordance with the invention;

FIG. 3B is a sectional view of the arrangement of FIG. 3A showing one form of traverse mechanism for a measurement system in accordance with the invention;

FIG. 6A is a bar graph showing the measurements made in accordance with the invention at the positions of eight illustrative supply boats; and FIG. 6B is a further bar graph showing the control over metallic thickness which is achievable in accordance with the invention.

DETAILED DESCRIPTION

Figure 1A:
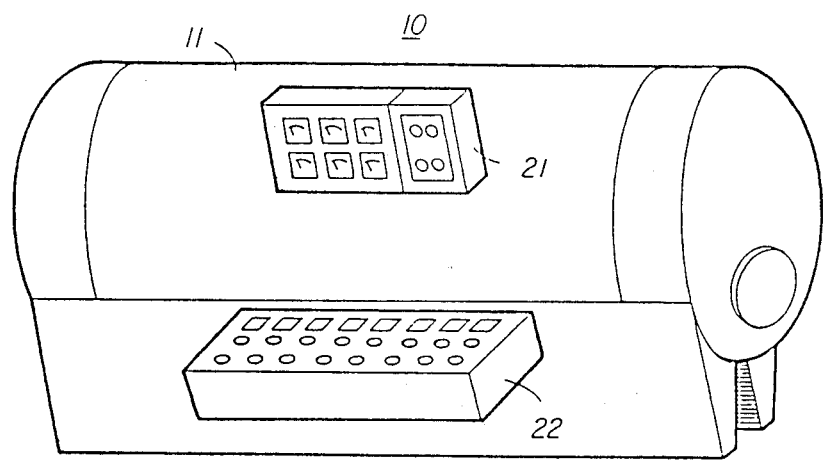
FIG. 1A is a perspective view of a high vacuum chamber for continuous metallization in accordance with the invention.
Figure 1B:
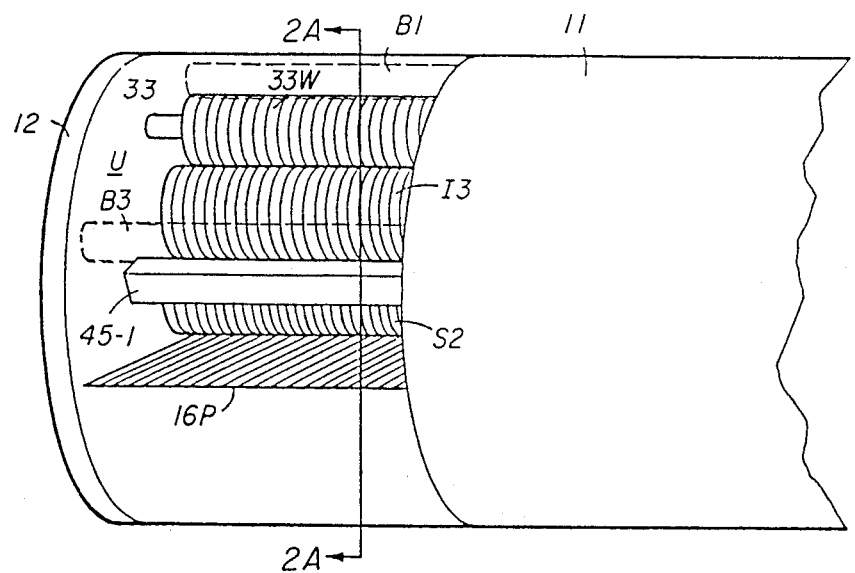
FIG. 1B is an enlarged fragment of the chamber of FIG. 1A, showing the chamber partially open to expose the interior arrangement for metallization and the measurement of the resulting metal film.

With reference to the drawings, FIG. 1A shows a deposition chamber 10 for the production of metallized materials. The chamber 10 has an outer shell 11 which is separable, as illustrated in FIG. 1B, to provide access to the interior. The chamber 10 is accompanied by various control panels 21 and 22 for controlling the rate of advance of the materials within the chamber 10, as well as the vaporization of the metal that is to be applied to a substrate or carrier within the chamber.

As indicated in FIG. 1B, the outer shell 11 has been moved laterally away from an end 12 to expose an upper portion U of the chamber 10. As can be seen in FIG. 1B, the outer shell 11 is movable away from the end 12 along bearing rods B1 and B3 which are shown in phantom outline. The sheet or substrate material that is being metallized is accumulated on a roll 33 and forms a web 33w. The feed to the roll 33 is over an idler I3 after having passed one of the components 45-1 of a measuring unit. The sheeting below the measuring component 45-1 is designated S2. The lower portion of the vacuum chamber (not exposed in FIG. 1B) contains the "boats" that are used to provide the metallic vapor that is deposited upon the sheeting S2 and produce a film whose thickness is measured by the gauge, including component 45-1, as explained in greater detail below.

Figure 2A:
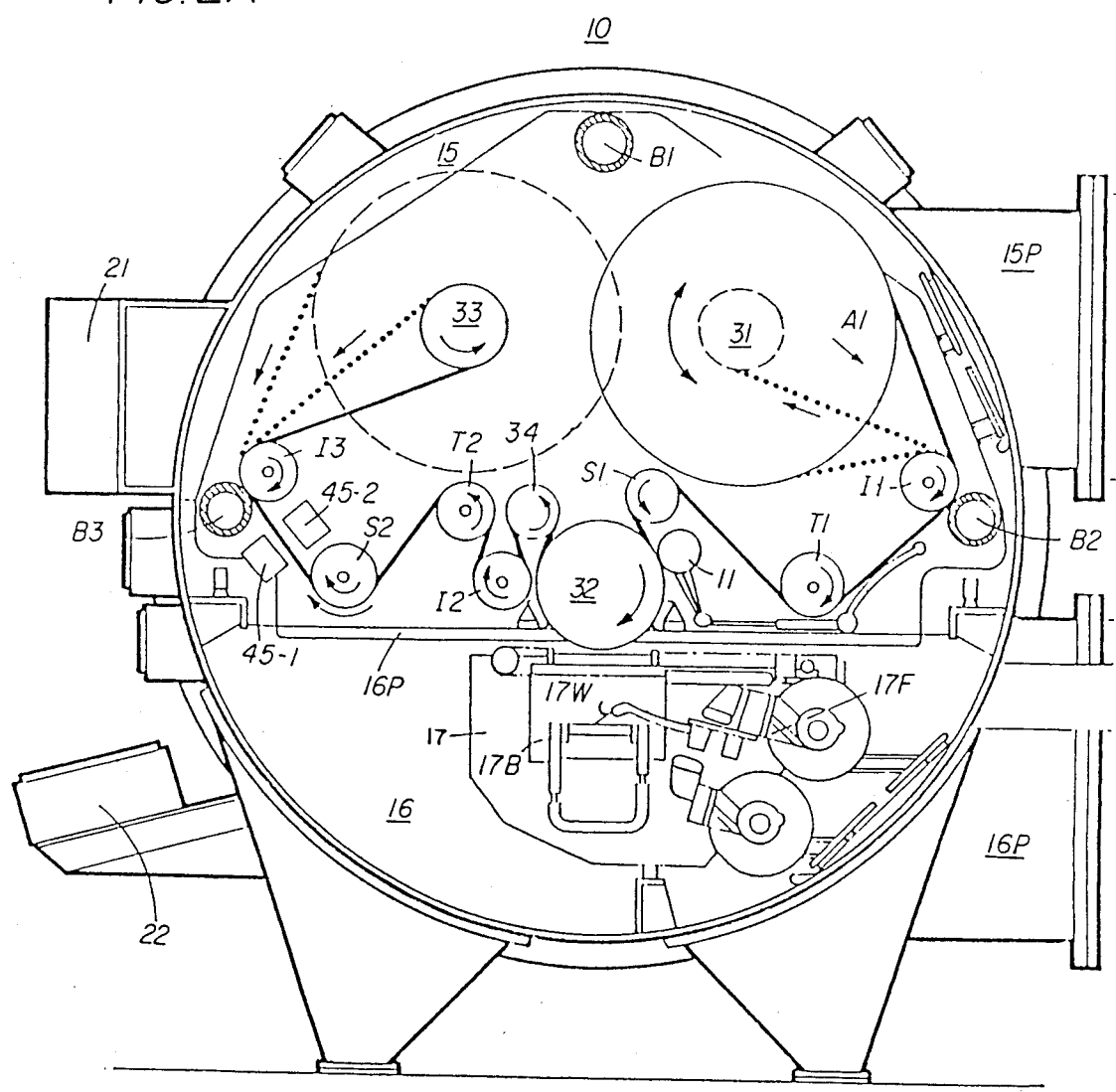
FIG. 2A is a cross-sectional view of the metallization chambers of FIG. 1A and FIG. 2A.

The mechanism for the feed, metallization and take-up of the carrier is illustrated in FIG. 2A which is a cross-sectional view of the partially open chamber of FIG. 1B viewed in the direction of the end 12.

As seen in FIG. 2A the bushing B1, B2 and B3 for slide of the outer shell 11 are in cross section. In operation of the chamber 10, a web of material, for example paper to be metallized, is applied to an axle 31. Sheeting from the web on the axle 31 is unwound in the direction indicated by the arrow A1 and brought into contact with a first idler roll I1. From the first idler roll, the web extends to a tensioning roll T1 which rotates in the direction indicated by the associated arrow. From the tensioning roll T1, the web extends to a spreader roll S1 which also rotates in the direction indicated by its associated arrow. From the spreader roll S1, the web extends to a water-cooled drum 32 that carries the web on the major portion of its circumference and in particular allows the web to be exposed to metallic vapors below the floor 16p. The latter is a plate that can be adjusted according to the size of the water-cooled drum 32. The metallic vapor that is applied to the web at the water-cooled drum 32 is described in greater detail below.

On the output side of the drum 32, the web extends to a second water-cooled drum 34 and then to a second Idler roll I2. From the second idler roll the web is advanced to a tensioning roll T2 and then to a second spreader roll S2.

From the second spreader roll S2 to a third Idler I3 the web traverses the measuring unit which is made up of components 45-1 and 45-2. These components are described in greater detail below. The end of the web that leaves the third idler roll I3 is applied to the take-up hub or axle 33.

In the regular process of metallizing, the take-up axle 33 rotates in the counter-clockwise direction indicated by its axle arrow. When the roll on the feed axle 31 has been completely metallized, the metallized sheeting is rewound on the axle 31 in the direction indicated by the dotted line path, as compared with the solid line path for the feed of the web during metallization.

The vacuum chamber 10 is in two distinctive zones 15 and 16, separated from one another by the transverse plate 16p which permits the water-cooled drum 32 to bring the web into contact with metallic vapors. The upper zone 15 has a lower vacuum than the bottom zone 16. The vacuums for the two zones are provided at pumping orifices 15p and 16p respectively.

Also visible in FIG. 2A are the control panels 21 and 22 with various control devices for determining the rate of advance of the materials within the chamber, as well as the rate of vaporization of the metal that is deposited upon the advancing web.

In particular the vacuum chamber 10 is used to deposit aluminum coating on a carrier such as lacquered paper in a thickness in the range from 1 to 10 ohms per square. This thickness measurement refers to the resistance of a square area of the resulting film. The greater the thickness, the lower is the resistance reading.

The desired aluminum coating is obtained by having the carrier web pass over an evaporating source. In order to promote the desired vaporization of the aluminum, which is fed in the form of a wire 17W in FIG. 2A to an associated boat 17B by a feed mechanism 17f, the vacuum should be greater than $10^{-3}$ torr. A torr is a unit of vacuum corresponding to 1000 microns.

The operation is semicontinuous in that it proceeds as long as the roll on the feed axle 31 has not been completely metallized. It is discontinous in the sense that after the roll from the axle 31 has been completely metallized, it is necessary to stop the operation for rewind.

In the evaporatoin zone 16 which is in the lower part of the vacuum chamber 10, the heating cycle of the evaporators is controlled manually or automatically. A moving cubicle is hydraulically driven to form the main vacuum seal. When the mechanism is traversed to its closed position it is held against the chamber by hydraulic pressure until vacuum is achieved. The associated controls are mounted on the front of the vacuum chamber.

Vacuum pumping is used to produce two levels of vacuum, a low level between $10^{-4}$ and $4 \times 10^{-4}$ torr in the upper zone where outgassing from the unwinding of the carrier reel is compensated, and a high vacuum, typically $5 \times 10^{-4}$ to $10^{-3}$ torr in the lower zone. Both zones have conventional pumping arrangements and cryogenic panels. Suitable pumping is provided by a vacuum pump which exhausts through oil mist eliminators to atmosphere and has mechanical boosters, as well as a vapor jet booster operating in parallel.

In the evaporation zone 16, there are a set of intermetallic boats with resistance heated elements. These are illustrated by boats 17B-1 through 17B-N of FIG. 4. Each boat is housed in a shielded trough and fed continuously with aluminum wire by an associated feeder 17F-1 through 17F-N. Electrical contact between the boats and the power feeds is made by frictional clamping using graphite tape. The power feed terminals are of a replacable metal and are mounted on water-cooled bus bars. Power for each of the terminals is advantageously by a three-phase system with a common bus connection to one end of all of the boats, commonly known as a star load. Individual wire bead units and guide spouts insulated from ground are fed from block wound aluminum wire reels. These are fitted for each boat and driven by a single variable speed motor. In addition an electromagnetic clutch is provided with each unit to allow interruptable wire feed.

The heating cycle for the boats can be manual or automatic. In automatic operation the controls are preset to a known operating condition and are provided with both "hold" and "run-down" operations. The trough has a movable shield operated from the mechanism control cubicle. A shutter actuating mechanism and wire feed drive are mounted on and transmitted through the end of the chamber by rotary vacuum seals on flanged ports. The source assembly is mounted in the lower zone 16 of the vacuum chamber and there are illustratively eight intermetallic boats which are used and distributed for comparatively uniform evaporation.

The invention provides for controlling the distribution and spacing of the boats as well as the feed of the aluminum wire and the temperature at which the vaporization takes place. This is done in order to control the thickness of the film that is applied to the advancing carrier within the vacuum chamber.

The evaporators are operated through regulated direct voltages in the range from 0 to 10 volts. The signal is applied across the resistance of a motorized potentiometer which increases its output in approximately linear fashion when energized. It is common practice for the preferred drive characteristic of the evaporators to be "square-law". As a result the linear signal is sent to a shaping and conditioning unit to convert it to the desired square-law characteristic. The signal thus conditioned is then fed by an amplifier to a relay module which applies a signal to the source control potentiometer. On start-up a prefed value is used so that a proportion of the demand signal is processed through amplifiers in the converter mode to firing surfaces which control power thyristors. There is one such thyristor for each evaporator. The time for increase from zero to maximum, and for decrease, is controllable by the measuring components 45-1 and 45-2.

The winding mechanism of FIGS. 2A and 2B provides a constant unfurling of the carrier over transport, spreader and nip rollers to the process drum, and then from the transport rollers and the spreader roller to the rewind drum for controlled tensioning. The entire roller arrangement is mounted in a rigid frame formed by two end plates and rigid cross ties.

The drives for the carrier transport take-up and unwind are desirably by induction coupling. The transport is initially operated as a constant speed drive to determine the machine running speed. A standard speed control excitation unit is provided and operates over positive and negative load conditions. The latter exist when the machine speed is greater than the demand speed. Operation is by a motorized potentiometer. To provide a constant tension break, the input can be driven in reverse to permit control down to zero speed. The take-up desirably operates as a constant tension rewind, but may be provided with variable tension where that is desirable.

The drive mechanisms automatically modify the torque output of an eddy current drive to achieve relatively constant tension in the carrier. A tachometer generator that is driven directly from the web gives an output proportional to line speed. A second tachometer generator driven by a mandrel provides an output proportional to the angular velocity. These signals are compared and a resultant applied to a servomechanism with twin potentiometers that are automatically repositioned to balance the output from the two generators. The torque transmitted or absorbed by the eddy current drive depends directly on the drive motor power. A conventional current transformer connected in the motor input supply gives a current signal that is amplified and converted to a linear voltage that is proportional to drive torque. The torque signal is a composite of the desired output and rewind characteristics, and includes the voltage across a tension control potentiometer, derived from a diameter measuring circuit and porportional to reel diameter.

The torque demand signal from tension control is added to signals representing breakaway torque, friction, windage and inertia. The resultant provides the desired composite torque for the drive. This resultant is compared with the actual drive torque and used to produce a different signal that is amplified to control the current of a drive field coil.

In controlling the axles 31 and 33 of FIG. 2B, the drive signals control unreeling and take-up. The carrier web 31w which is to be metallized on one surface, is unwound and led over a first idler roll I1. From the idler roll I1 the web advances in the direction indicated by the arrow to a first tensioning roll T1. The web then extends from the tensioning roll T1 to a spreader roll S1. From there it is wrapped around the water-cooled drum 32. The desired metallization takes place at the gap in a panel 16p which permits the underside of the roll 32 and the associated web to be exposed to metallic vapor. The film that is formed on the web is then advanced to a second water-cooled drum 34 of smaller diameter and then fed to a second idler I2. The web extends to a second tensioning roll T2 and then to a second spreader S2. From the spreader to a third idler I3 the metallized carrier passes between the heads 45-I and 45-2 of a measuring system.

The measuring heads are shown in detail in the cross sectional view of FIG. 3A. In particular each of the head units 45-1 and 45-2 is on a roller plate. In the case of unit 45-1 the plate is secured to rollers 45C-1 and 45C-1' and to further rollers 45E-1 and 45E-1' as shown in FIG. 3B. On the case of unit 45-2 corresponding rollers 45C-2 and 45C-2' are shown in FIG. 3A. As a result of this mounting, the unit 45-1 is able traverse the width of the web since its rollers 45C-1 and 45C-1' are positioned in respective tracks of a support 45B-1. The unit 45-2 is similarly mounted with respect to a support 45B-2. Movement of the measuring heads 45-1 and 45-2 is accomplished by screw feed drivers 45D-1 and 45D-2.

Details of arrangement in FIG. 3A are shown in FIG. 3B. For clarification the unit 45-2 is shown at the end of its traverse, while the unit 45-1 is shown at the beginning of its traverse. It will be understood that the units 45-1 and 45-2 are mounted so that they move jointly, with the unit 45-1 on one side of the metallized support and the unit 45-2 on the other side. As indicated in FIG. 3B the drive 45D-1 is by a belt 45B from a pulley 45P. This rotates the associated screw 45S-1. It will be noted that the measuring unit is a cup-like container with an internal coil that is more particularly described below. The cup container 45F-1 extends to a cylindrical abuttment 45G-1 which is in turn connected to a coaxial cable cable 45H-1.

Figure 4:
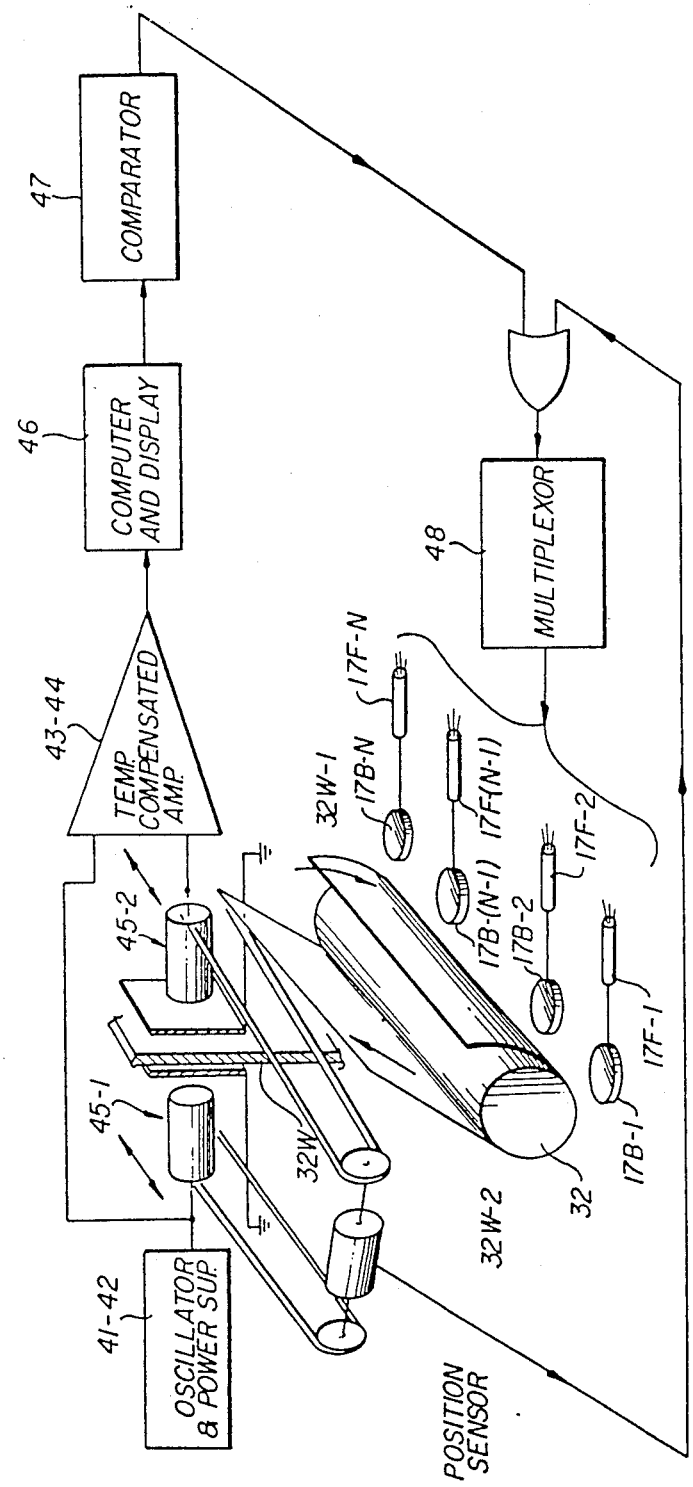
FIG. 4 is a schematic view of a control system for metallization in accordance with the invention.

A block and schematic view of a measuring and control arrangement employing the measuring units 45-1 and 45-2 is shown in FIG. 4. An oscillator and power supply 41-42 is used to energize the coil portion of the measuring unit 45-1 on one side of the web 32W. A similar coil portion 45-2 which moves jointly with the coaxial coil portion 45-1 on the opposite side of the web 32W. This is connected to a temperature compensated amplifier which receives the eddy current signal that is induced in the metallic film of the web 32W. The temperature compensated signal is applied to a computer and display unit 46 and then to a comparator 47. The latter has one input applied to multiplexor 48 through an OR gate simultaneously with an input from a position sensor at the drive mechanism for the measuring heads 45-1 and 45-2.

The purpose of the multiplexor 48 is to coordinate the readings obtained by the measuring head 45-2 with the positions of the boats 17B-1 through 17B-N for the roll 32. Thus when the measuring head 45-2 is at a position relative to the web 32W that corresponds to the boat 17B-1, signals are applied simultaneously to the multiplexor from the position sensor and from the comparator. If the comparator output indicates that the film thickness should be increased, i.e. the comparison indicates that the film is below the level of thickness that is desired, appropriate compensation is made at the metallizing circuitry. This can involve an increase in the temperature of the boat 17B-1, an increase in the wire feed by the unit 17F-1, a movement (not shown) of the boat 17B-1 towards the roll 32, or a movement laterally of the boat 17B-1 towards the adjoining boat 17B-2.

It will be appreciated that the corrective action may be made manually or automatically as desired.

Figure 5A:
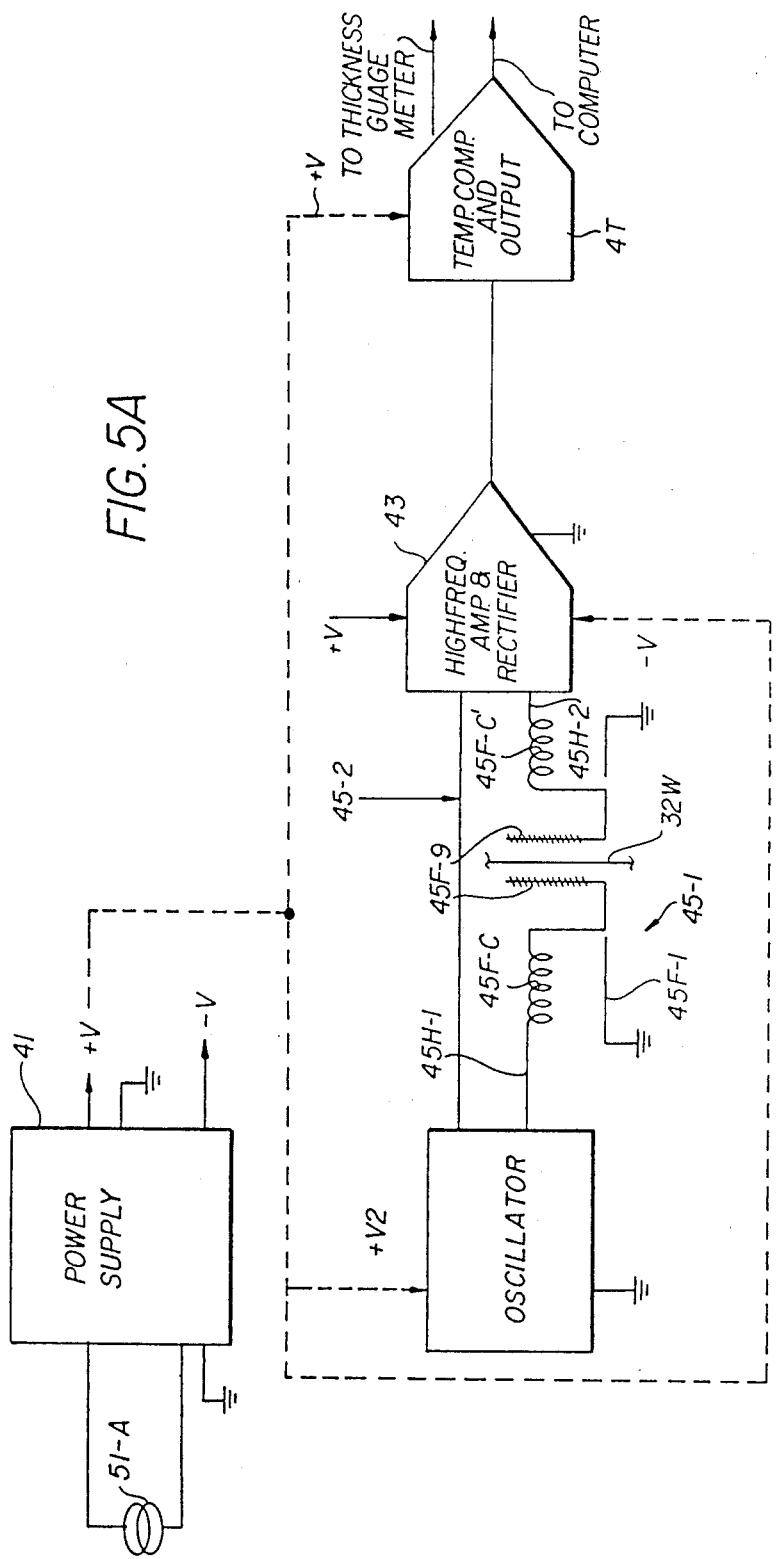
FIG. 5A is an overall block diagram for the measurement portion of the metallization system of FIG. 4.

Circuit details for the measuring and control circuitry are outlined in FIG. 5A. A power supply 41 is used to supply a positive voltage V1 and a negative voltage $-V1$ to other units. The power supply 41 is energized from an ordinary AC source 51-A. The energized units include an oscillator 42, a high frequency amplifier 43 and a temperature compensating output unit 44. The oscillator 42 produces an output to a coil 45F-C that is shielded by a ground member 45F-G. The interval between the coil 45F-C and the similar coil 45F-C' accommodates the metallized web 32W.

The first coil 45F-C produces eddy currents in the metallic film of the web 32W and these are detected by the second coil 45F-C'. The output from the coil 45F-C' is applied to the high frequency amplifier 43. The output of the latter is applied to the temperature compensator and output unit 44, from which further outputs are applied as desired, e.g. to a control computer and a thickness guage meter (not shown).

Figure 5B:
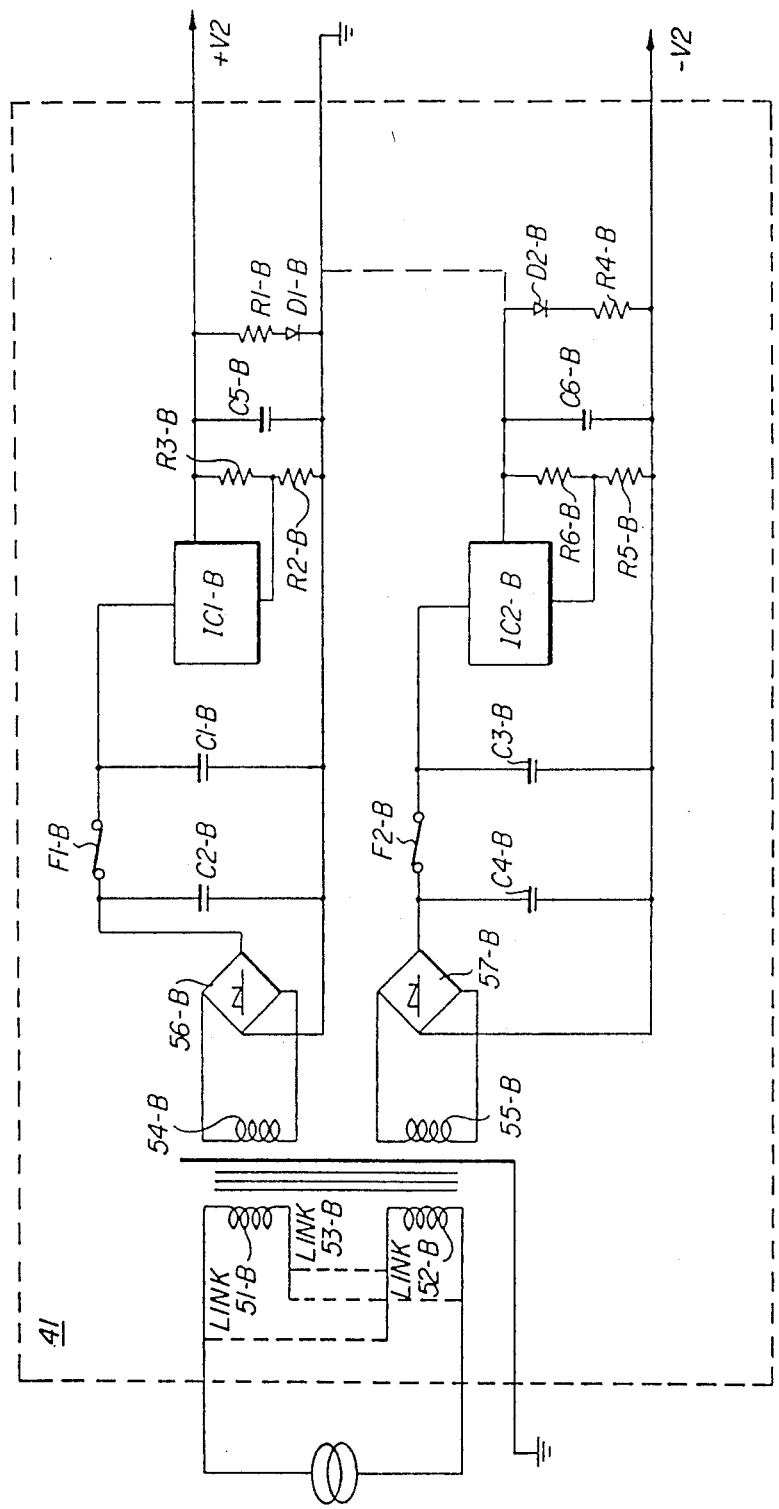
FIG. 5B is a block and schematic diagram for the power supply of FIG. 5A.

Details for the power supply 41 of FIG. 5A are set forth in FIG. 5B. The power supply converts an input signal from source 51A to positive and negative outputs respectively designated $+V2$ and $-V2$. These outputs are used in supplying the various components within the oscillator 42, the high frequency amplifier 43 and the temperature compensated output unit 44.

The alternating current signal from the source 51A is applied to a transformer with secondary windings 54-B and 55-B for respective full wave bridge rectifiers 56-B and 57-B. The output from each bridge rectifier is applied to a filter and then to respective integrated circuits IC1-B and IC2-B. The latter are used in providing desired smoothing. It is important for the operation of the other components that power supply levels be accurately controlled.

Figure 5C:
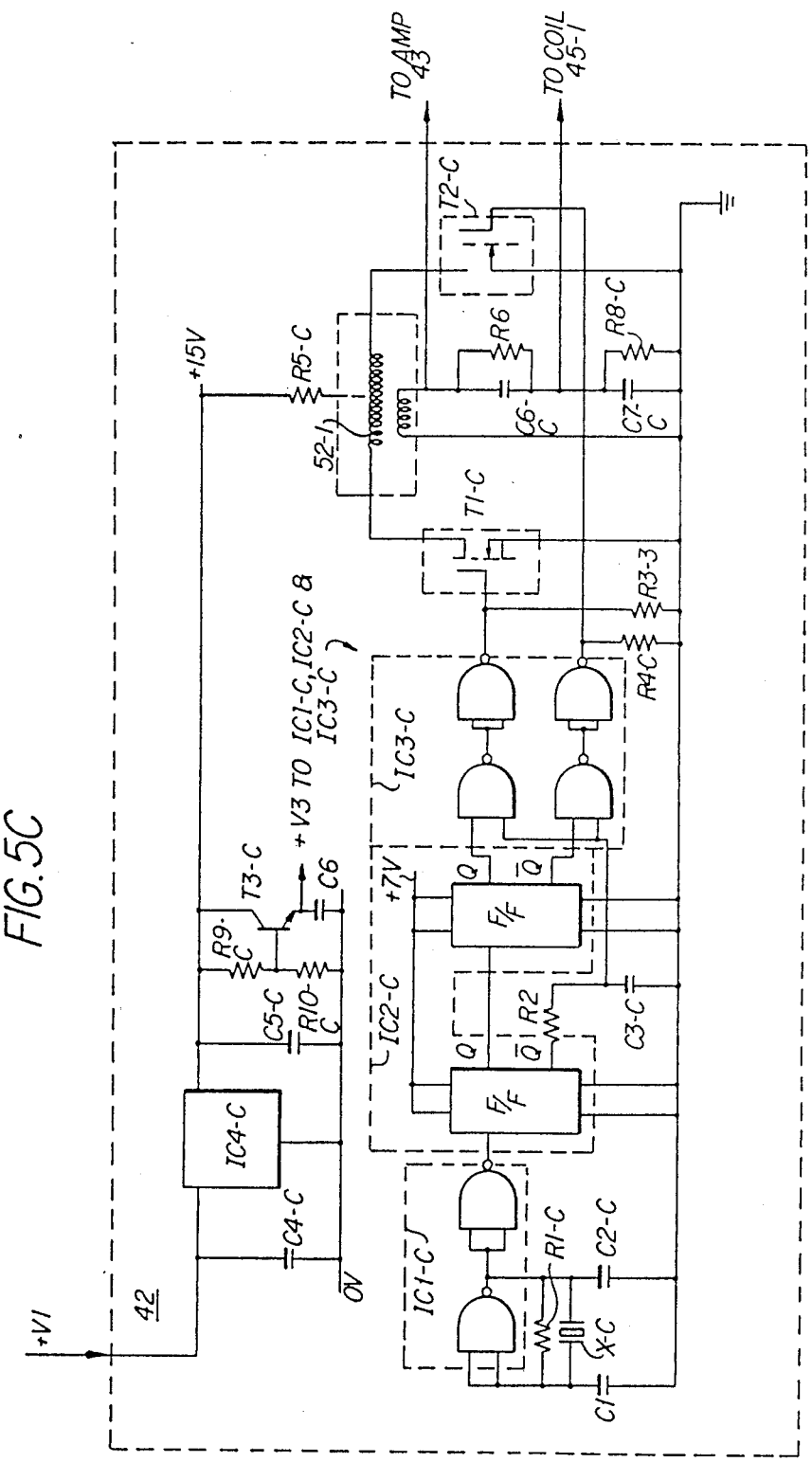
FIG. 5C is a block and schematic diagram for the oscillator of FIG. 5A.

One of the subordinate units powered by the supply 41 is the oscillator 42 of FIG. 5C. The oscillator uses crystal X-C to generate a periodic wave form at a desired relatively high frequency. For the purpose integrated circuits are employed in a block IC1-C as inputs to a flip-flop arrangement formed by a second integrated circuit IC2-C. The output from the flip-flop is supplied to respective gates in a third integrated circuit IC3-C. Field effect transistors T1-C and T2-C are used in applying the output to the first coil 45-1. This provides the desired eddy current energization of the metallic film in the metallized web 32W shown in FIG. 5A.

Figure 5D:
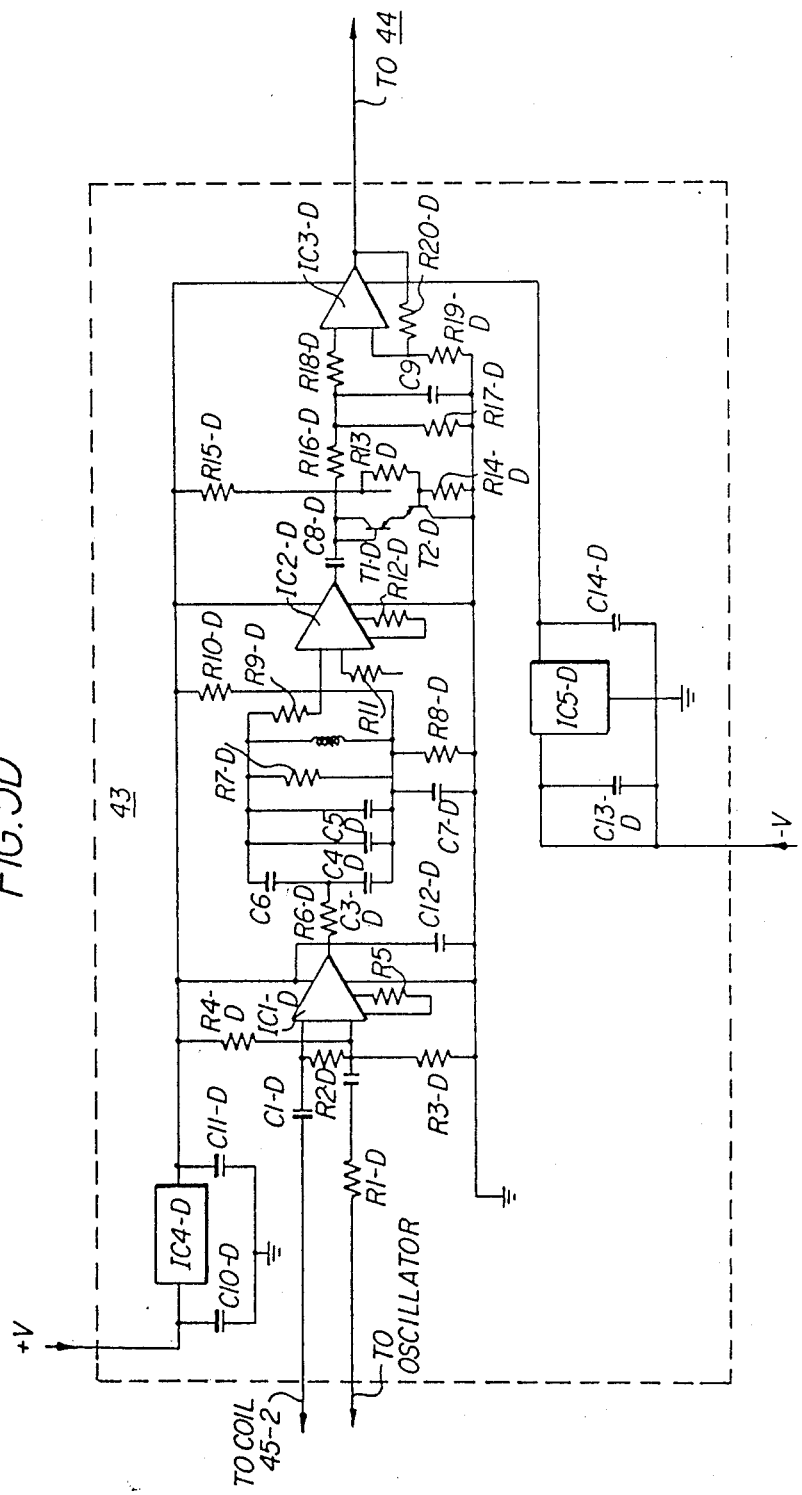
FIG. 5D is a block and schematic diagram of the high frequency amplifier and rectifier for the circuitry of FIG. 5A.
Figure 5E:
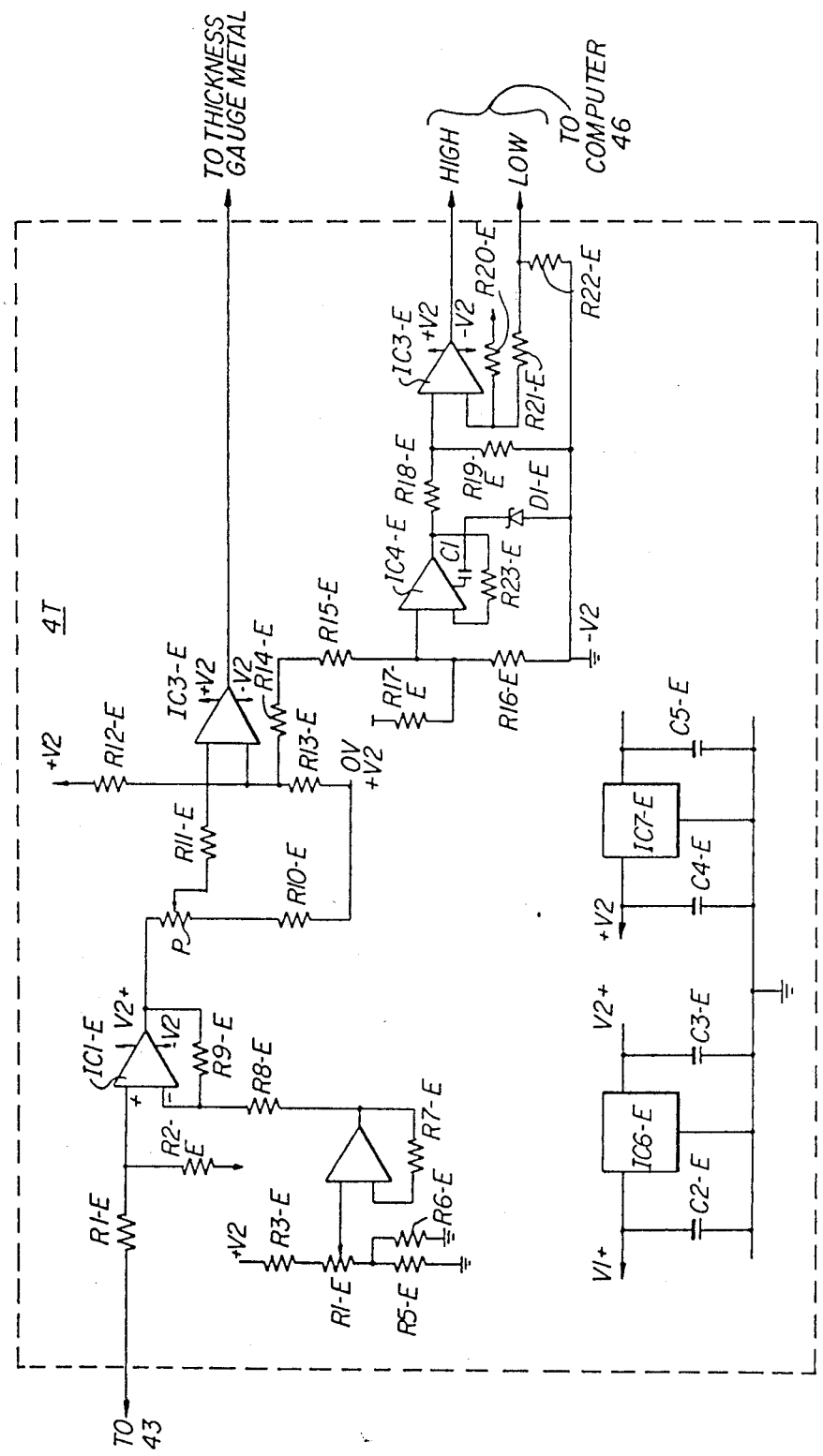
FIG. 5E is a block and schematic diagram for the temperature compensator and output circuitry of FIG. 5A.

The pickup is from the second coil 45-2 and is applied to the high frequency amplifier 43 shown in FIG. 5D. The latter is made up of a differential amplifier IC1-D followed by a set of smoothing amplifiers IC2-D and IC3-D. The output from the high frequency amplifier 43 is applied to a temperature compensated amplifier 44 which is shown in FIG. 5E.

Suitable integrated circuit components are set forth in the table below:

TABLE I
Illustrative Integrated Circuit Identification

| Component | Designation | IC Type |
|---|---|---|
| 41 (FIG. 5B) | IC1-B | 317 K |
| | IC2-B | 317 K |
| 42 (FIG. 5C) | IC1-C | 4011 |
| | IC2-C | 4027 |
| | IC3-C | 4011 |
| | IC4-C | 78L15 |
| 43 (FIG. 5D) | IC1-D | 733 |
| | IC2-D | 733 |
| | IC3-D | 741 |
| | IC4-D | 78L15 |
| | IC5-D | 79L15 |
| 44 (FIG. 5E) | IC1-E | 741 |
| | IC2-E | 741 |
| | IC3-E | 741 |
| | IC4-E | 301A |
| | IC5-E | 741 |
| | IC6-E | 78L15 |
| | IC7-E | 79L15 |

As the measurement heads 45-1 and 45-2 traverse the metallized web, a reading is obtained for each measurement position. The measurement positions may coincide exactly with the positions of the respective boats or may be displaced to one side or another depending upon the kind of correction that is to be effected in the metallized film that is formed on the web.

In one application of the circuitry, a measurement is taken at each boat position. For this arrangement it is desirable for the measurements to be of substantially uniform relative amplitude in order to indicate that the film found on the web is of comparatively uniform thickness.

In an illustrative traverse of the web with readings taken at each boat position their relative values are illustrated in FIG. 6A. It is noted that the distribution of readings is a variable and that the desired uniformity is absent. By applying the signals corresponding to FIG. 6A to the comparator and making various adjustments in the boats, for example by bringing the boats closer to the web where the signal is low or by moving the boat farther away from the web where the signal is too high an appropriate compensation can be made with the result shown in FIG. 6B.

While various aspects of the invention have been set forth by the drawings and the specification, it is to be understood that the foregoing detailed description is for illustration only and the various changes in parts, as well as the substitution of equivalent constituents for those shown and described, may be made without departing from the spirit and scope of the invention as set forth in the appended claims.

What is claimed is:

1. The method of metallizing a longitudinally extending substrate which comprises the steps of:
   (a) applying a metallic film to said substrate; and
   (b) measuring said film thickness by inducing an eddy current in the film which is detected and used to provide an indication of said film thickness.

2. The method of metallizing a longitudinally extending substrate which comprises the steps of:
   (a) applying a metallic film to said substrate; and
   (b) measuring said film thickness by inducing an eddy current in the film which is detected and used to provide an indication of said film thickness,
   (c) compensating the application of said metallic film in accordance with the measure determined therefor wherein the metallic film is applied to said substrate from a plurality of boats below a web for said substrate and the film that is applied thereto is determined at each boat position, and
   (d) adjusting the position of the boats in accordance with the measurements made of the metal thickness.

* * * * *